(12) United States Patent
Foong et al.

(10) Patent No.: US 11,821,916 B2
(45) Date of Patent: Nov. 21, 2023

(54) GROUND CONNECTOR IN AN INTEGRATED CIRCUIT TESTING APPARATUS

(71) Applicant: JF MICROTECHNOLOGY SDN. BHD., Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Fadzhirul Ridhzwan Azry Bin Sulaiman, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 17/710,818

(22) Filed: Mar. 31, 2022

(65) Prior Publication Data
US 2022/0317152 A1    Oct. 6, 2022

(30) Foreign Application Priority Data
Mar. 31, 2021    (MY) .......................... PI 2021001768

(51) Int. Cl.
  *G01R 1/04*    (2006.01)
  *H01R 13/24*    (2006.01)

(52) U.S. Cl.
  CPC ....... *G01R 1/0466* (2013.01); *H01R 13/2414* (2013.01)

(58) Field of Classification Search
  CPC .... G01R 1/0466; G01R 1/045; G01R 1/0441; H01R 13/2414; H01R 12/7076; H01R 13/2407; H01R 12/714; H01R 13/648; H01R 13/62; H05K 7/2039
  See application file for complete search history.

(56) References Cited

U.S. PATENT DOCUMENTS

| | | | |
|---|---|---|---|
| 5,629,831 A * | 5/1997 | Eggert | H05K 7/1472 361/728 |
| 9,140,721 B2 * | 9/2015 | Foong | G01R 1/0466 |
| 9,274,141 B1 * | 3/2016 | Andres | G01R 31/2887 |
| 9,658,248 B2 | 5/2017 | Foong et al. | |
| 2007/0272924 A1 * | 11/2007 | Yung-Sing | G01R 1/0466 257/48 |

\* cited by examiner

*Primary Examiner* — Giovanni Astacio-Oquendo
*Assistant Examiner* — Zannatul Ferdous
(74) *Attorney, Agent, or Firm* — Maschoff Brennan

(57) ABSTRACT

An electrical ground connector for use as part of a test connector in an integrated circuit (IC) device testing apparatus having a resilient connector for electrical grounding and comprising a dual elastomer contact stacked vertically above a rigid ground block. The height of the ground block can be adjusted to compensate for the lack of height of the dual elastomer contacts, so that the entire connector has enough height to maintain electrical connection between a load board of the testing apparatus and the IC device.

3 Claims, 6 Drawing Sheets

GROUND CONNECTOR IN AN INTEGRATED CIRCUIT TESTING APPARATUS

FIELD OF INVENTION

The present invention relates generally to electrical connectors, and more specifically to a ground electrical connector of an integrated circuit testing apparatus.

BACKGROUND OF INVENTION

In the field of integrated circuit (IC) device testing, proper electrical grounding between the IC device and test apparatus is extremely important to reduce the chances of false test results. Currently, the solutions for electrical grounding in IC device testing can be divided between those for larger IC devices (3 mm or larger) and those for smaller IC devices (3 mm or smaller). Further, a resilient connector is preferable for many reasons. Rigid connectors increase the chances of damage to the contact pads and IC die from the impact each time an IC device is lowered onto the testing apparatus.

One type of test connector used to establish electrical connection between a load board of the test apparatus and the IC device under test comprises an array of signal pins arranged along the perimeter of the rectangular or square shaped connector. The central area inside that perimeter is reserved for the electrical ground connectors, as it is adjacent to the centrally located ground contacts of the IC device. For larger IC device testing, the test connector has enough space within this central area for containing resilient ground connectors. However, for smaller IC devices, there is just not enough space in this central area to contain resilient connectors.

In U.S. Pat. No. 9,658,248 (Foong, et al), there is described a resilient ground connector. The design of this particular connector does not allow it to be constructed to very small dimensions, and so it cannot be used for smaller IC devices. Furthermore, this design requires the electrical current to travel a longer distance through the connector. When it comes to testing of high radio frequency (RF) IC chips, it is preferable to minimize the distance travelled by the electrical current to achieve the most accurate test results.

Currently, the grounding solution for smaller IC device testing is an electrically conductive rigid block with a flat contact surface that does not provide any resilience or cushioning for the ground contact pads of the IC device. This lack of cushioning can lead to damage to the IC device and to the rigid block itself. Damage or imprints to the rigid block can affect the accuracy of test results. Using a rigid block as a ground connector can also lead to debris accumulation on the surface of the rigid block, which causes increased electrical resistance during a test, requiring regular cleaning of the rigid block and surrounding area. Rigid blocks are also less flexible for use in tests that have multiple settings/dimensions.

There are resilient connectors that can be constructed to very small dimensions, such as the dual elastomer contact design taught in U.S. Pat. No. 9,140,721 (Foong, et al). The design of this connector, while suitable for manufacture to very small dimensions, is however too short for use as a ground connector, and thus has never been used as a ground connector.

It is therefore desirable to have an electrical ground connector that is resilient, is able to be constructed to small dimensions, and is of a sufficient height in order to be used as a ground connector.

SUMMARY OF INVENTION

The present invention seeks to overcome the aforementioned disadvantages by providing electrical ground connector for use as part of a test connector in an integrated circuit (IC) device testing apparatus having a resilient connector for electrical grounding and comprising a dual elastomer contact stacked vertically above a rigid ground block. The height of the ground block can be adjusted to compensate for the lack of height of the dual elastomer contacts, so that the entire connector has enough height to maintain electrical connection between a load board of the testing apparatus and the IC device. The height required depends on the test height of signal contact pins located around a perimeter of the connector.

This invention thus relates to a ground connector for use as part of a test connector in an IC testing apparatus, comprising: an electrically conductive rigid ground block having a height $h_1$ and a bottom surface in electrical contact with a contact pad of a load board of the testing apparatus; a dual elastomer contact vertically above and contiguous with the ground block and having a height $h_2$, and comprising: a first elastomer (26), a second elastomer (28), a contact body having a contact tip located at a top end of the contact body and, during a test, in electrical contact with a contact pad of the integrated circuit device, a contact surface located at a bottom end of the contact body and in electrical contact with a top surface of the ground block, a first cavity for receiving the first elastomer and a second cavity for receiving the second elastomer.

In a preferred embodiment, the ground connector of this invention further comprises a means of securing the ground block to the rest of the test connector, so that it does not drop when the test connector is lifted off the load board. In other words, this is a means of attaching the ground block to the rest of the test connector. In a preferred embodiment, this means of securing the ground block to the test connector is a pair of retentions located underneath a pair of hooks extending from opposing sides of the top surface of the ground block and running along the length of each said opposing side, such that the retentions engage the hooks thus preventing the ground block from dropping away from the test connector.

In another preferred embodiment, the ground block bottom surface is fashioned into a plurality of protrusions such as spikes or bumps that cover a portion of or the entire bottom surface, for the purpose of enhancing electrical contact with uneven load board contact pads.

This invention thus solves the problem of the size constraint of the central area of a test connector. It provides a ground connector that is around half the size of the signal pins located around the perimeter of the test connector.

This invention also solves the problem of the accumulated debris on the rigid ground block affecting test results. Since the IC device contact pads now contacts the resilient dual elastomer contacts and does not contact the ground block directly, any debris accumulated on the flat ground block surface will not affect testing. The design of the ground block also prevents accumulated debris from falling onto the testing apparatus load board. This prolongs the service life of the load board.

This invention also solves the problem of achieving accurate test results for testing of RF IC chips. The shorter dual elastomer contact means that the electrical current travels a shorter distance through the connectors before it reaches the ground block, which due to its volume does not cause noticeable signal loss.

Another advantage of combining a rigid ground block with a resilient connector is the heat dissipation provided by the ground block. IC devices can heat up during testing, and this heat transfers to the electrical connectors. The rigid ground block absorbs some of this heat because of its volume, thus acting as a cooling solution.

A further advantage of combining a rigid ground block with a resilient connector is that the load board surface lasts longer than it would if a resilient connector were placed directly above it. The scraping of the connector against the load board would cause wear and tear on the load board surface.

Yet another advantage of combining a rigid ground block with a resilient connector is the absorption properties provided by the ground block on electrical noise inherent in the ground connectors. The ground block absorbs some of the noises created during testing.

The advantages of having a dual elastomer contact as a resilient ground connector compared to the known rigid block only solution are as follows:

1) Better electrical connection.
2) Longer service life and repeatable/consistent tests.
3) Flexible for use with multiple settings and setups, and allows higher tolerance of parts dimensions.
4) Actuating grounding wipes through the oxide layer for good contact to the ground pads.
5) Provides a shield/protection barrier to the debris falling down to the load board that over time can damage the load board and cause shorting of during testing.
6) Easier maintenance and lower down time.

Other objects and advantages will be more fully apparent from the following disclosure and appended claims.

DETAILED DESCRIPTION OF INVENTION

Figure 1:
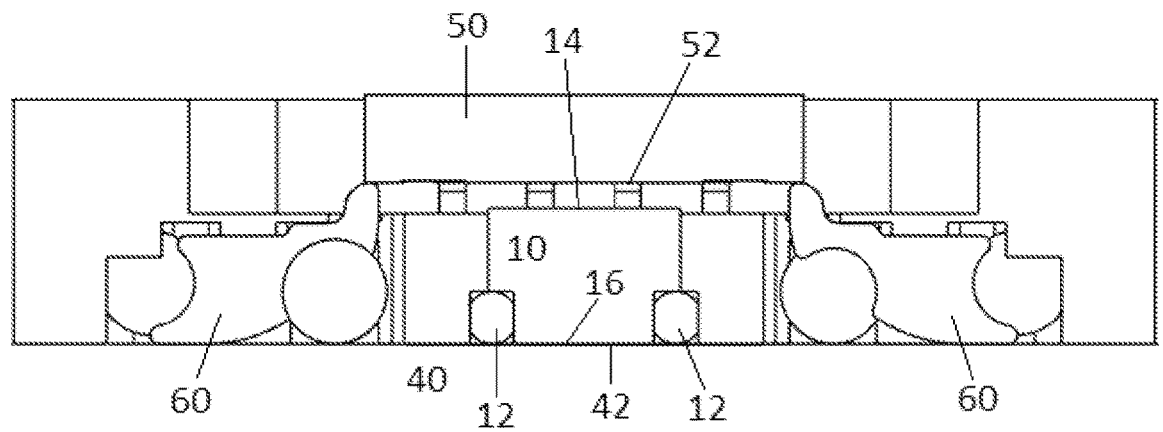
FIG. 1 shows a cross-sectional view of a known ground connector within the rest of a test connector.

It should be noted that the following detailed description is directed to a ground electrical connector of an integrated circuit testing apparatus, and is not limited to any particular size or configuration but in fact a multitude of sizes and configurations within the general scope of the following description.

LIST OF NUMBERED ELEMENTS IN FIGURES

Ground block (10)
Ground block retention (12)
Ground block top surface (14)
Ground block bottom surface (16)
Ground block spikes (17)
Ground block hooks (18)
Dual elastomer contact (20)
Contact body (22)
Contact tip (222)
Contact surface (224)
First cavity (226)
Second cavity (228)
First elastomer (26)
Second elastomer (28)
Housing (30)
First housing wall (32)
Second housing wall (34)
Load board (40)
Load board contact pad (42)
Integrated circuit device (50)
Integrated circuit device contact pad (52)
Signal pins (60)

FIG. 1 shows a front cross-sectional view of a previously known solution for creating an electrical grounding connection between a load board (40) of a test apparatus and an integrated circuit (IC) device (50) under test. This type of test connector comprises an array of signal pins (60) arranged along the perimeter of the rectangular or square shaped (when seen from a top-down view) connector. The central area inside that perimeter of signal pins (60) is reserved for the electrical ground connectors, as it is adjacent to the centrally located ground contacts pads (52) of the IC device (50). As IC devices get smaller and smaller, this central area reaches sizes too small for currently known resilient ground connectors to fit inside. Hence the current solution for ground connectors in very small (less than 3 mm×3 mm) IC devices is that shown in FIG. 1, which is simply a rigid ground block (10) made of an electrically conductive material such as copper. This ground block (10) has a top surface (14) that, during a test, comes into electrical contact with the ground contact pads (52), and a bottom surface (16) in electrical contact with contact pads (42) of the load board (40).

Figure 2:
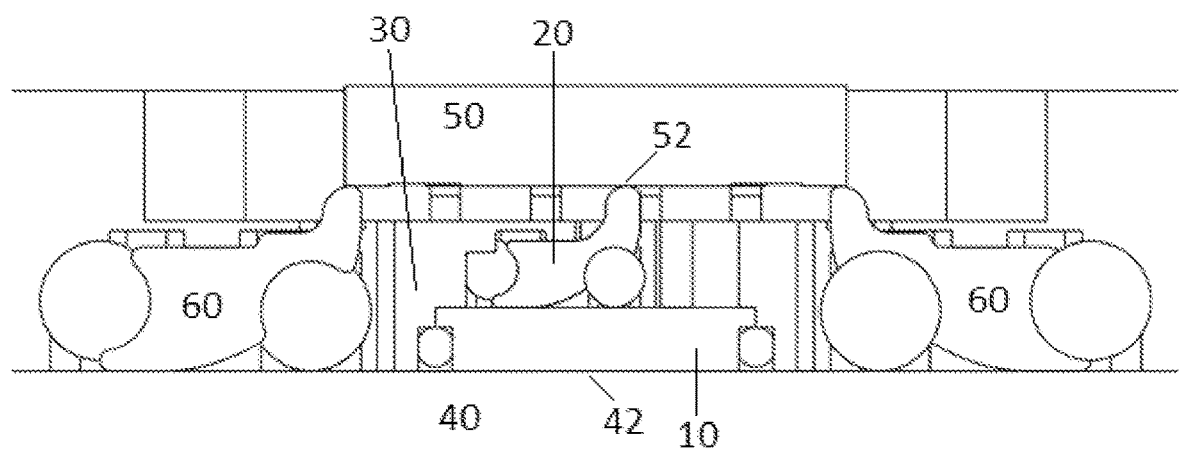
FIG. 2 shows a cross-sectional view of a ground connector within the rest of a test connector in a first embodiment of the present invention.
Figure 3:
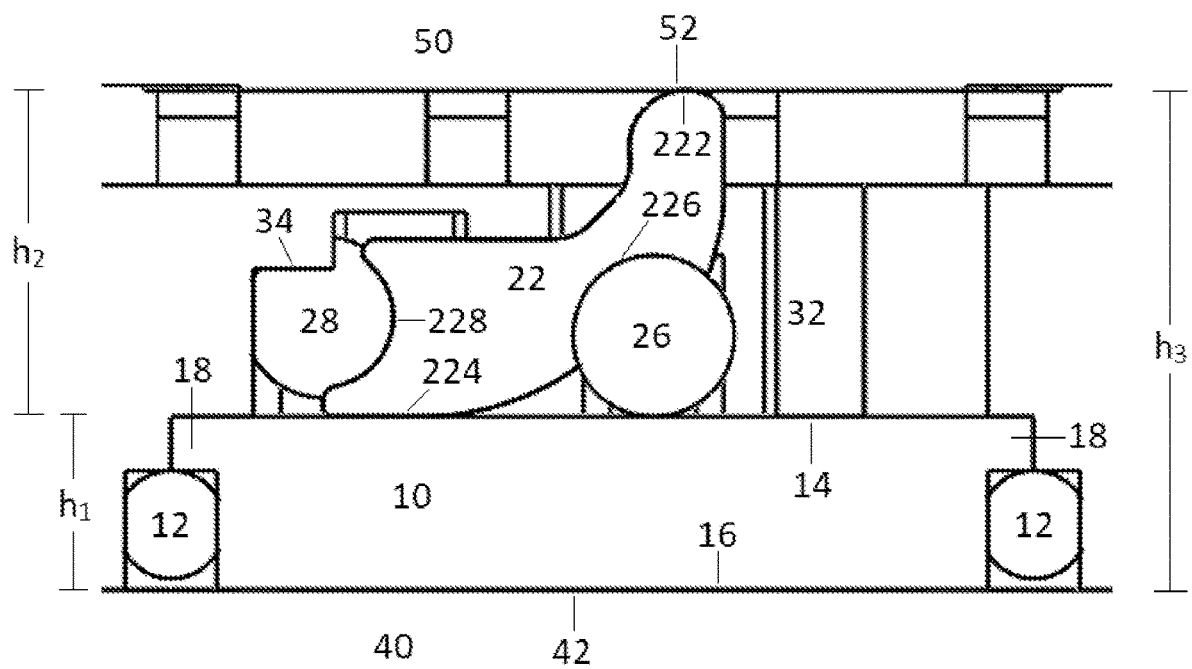
FIG. 3 shows an enlarged cross-sectional view of a ground connector in a first embodiment of the present invention.

FIG. 2 shows a cross-sectional view of an electrical ground connector positioned within the rest of a test connector used to establish electrical connection between a load board (40) of a test apparatus and an integrated circuit (IC) device (50) in a first embodiment of the present invention. To be clear, "test connector" refers to the ground connector of this invention and the other elements that comprise the test connector, including the signal pins located along a perimeter of the test connector. FIG. 3 is an enlarged view of FIG. 2, showing mainly the ground connector of this first embodiment in more detail. Referring to both FIGS. 2 and 3, the structure and function of the ground connector in this first embodiment will now be described.

In this first embodiment, there is provided an electrically conductive rigid ground block (10) having a height $h_1$ and a bottom surface (16) in electrical contact with a contact pad (42) of the load board (40) of the testing apparatus, and a top surface (14). Along two opposing sides and near the top of the ground block (10) are protrusions or hooks (18) running along the length of each opposing side. These hooks (18) extend outwards so that the top surface (14) is slightly larger than the bottom surface (16). The function of these hooks (18) is to hook onto a pair of ground block retentions (12). Once the ground connector is assembled, the retentions (12) secure the ground block (10) to the test connector, and prevents it from dropping when the test connector is lifted off the load board (40). These retentions (12) can be made of an electrical conductor such as beryllium copper.

There is also provided a dual elastomer contact (20) vertically above and in contact with the ground block (10) and having a height $h_2$. This dual elastomer contact (20) comprises three main structural elements: a contact body (22), a first elastomer (26), and a second elastomer (28). The contact body (22) is a single piece and made of an electrically conductive material. The contact body (22) has a contact tip (222) located at a top end of the contact body and in electrical contact with a contact pad (52) of the integrated circuit device (50) during a test, a contact surface (224) located at a bottom end of the contact body and in electrical contact with the top surface (14) of the ground block, a first cavity (226) for receiving the first elastomer (26) and a second cavity (228) for receiving the second elastomer (28). The first elastomer (26) and the second elastomer (28) are made of a non-conductive resilient material, and are generally fashioned into cylinder shaped lengths so that each elastomer can be used as a resilient member for multiple contacts that are arranged in a row. The first elastomer (26) is held securely by the first cavity (226) and the ground block top surface (14). In a variation of this embodiment, the first elastomer (26) can further be secured by a first housing wall (32). The second elastomer (28) is held securely by the second cavity (228) and a second housing wall (34).

The rigid block (10) has a height $h_1$ and the dual elastomer contact (20) has a height $h_2$. The total distance or height from the load board (40) to the IC device ground contact pads (52) is $h_3$. As there are many combinations of settings and setups in IC device testing, the height $h_3$ can vary. This invention allows the use of a dual elastomer contact (20) of a given height to be used as a resilient ground connector by simply adjusting the height $h_1$ of the ground block (10) in accordance with the formula $h_1+h_2=h_3$.

Figure 4:
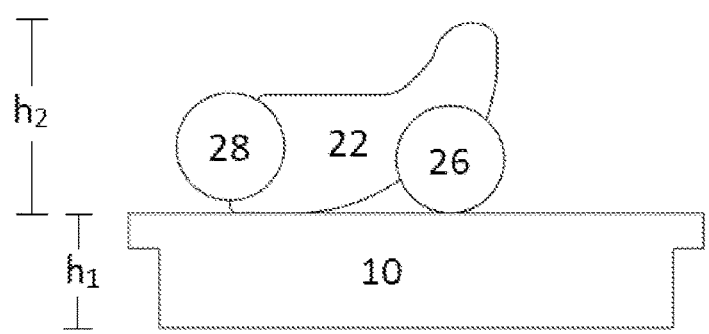
FIG. 4 shows a front view of a ground connector in a first embodiment of the present invention.

FIG. 4 shows the ground connector in this first embodiment, before being assembled into the rest of the test connector. The main elements of the ground connector can be seen in this figure: contact body (22), first elastomer (26), second elastomer (28) and rigid block (10).

Figure 5:
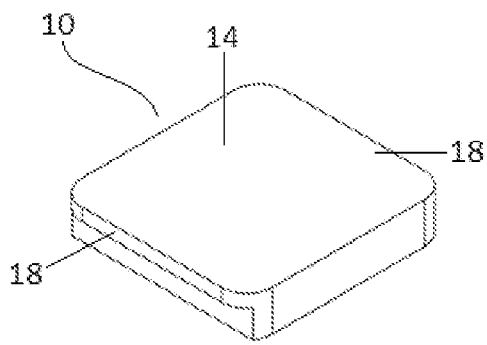
FIG. 5 shows a top perspective view of a rigid block in a first embodiment of the present invention.
Figure 6:
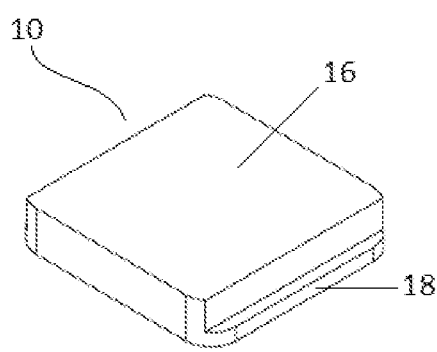
FIG. 6 shows a bottom perspective view of a rigid block in a first embodiment of the present invention.

FIGS. 5 and 6 show, respectively, top and bottom perspective views of the ground block in the first embodiment of this invention. There is shown the ground block (10) which is a single piece of an electrically conductive material such as copper alloys including but not limited to beryllium copper having a top surface (14) and a bottom surface (16). The ground block hooks (18) running along the length of each opposing side of the top surface (14) can be clearly seen in these figures.

Figure 7:
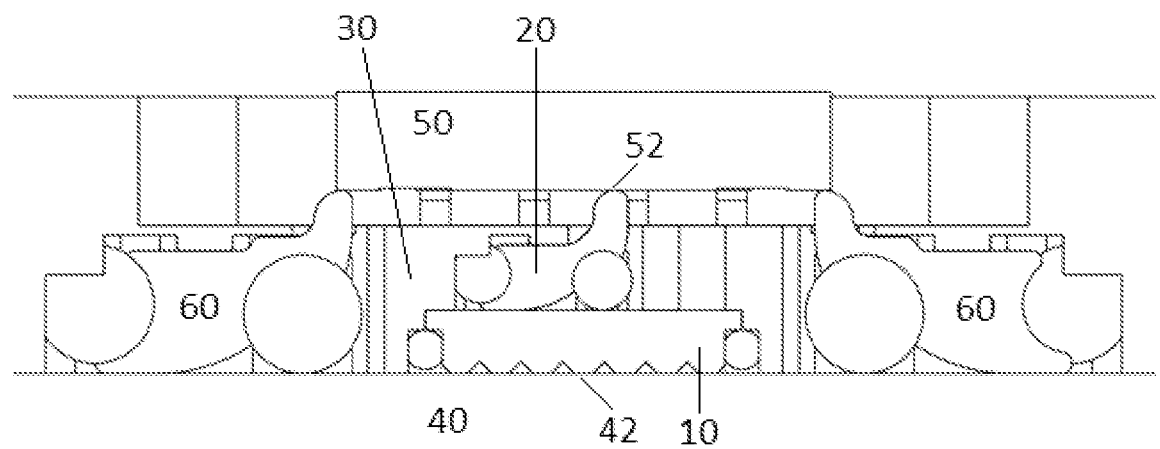
FIG. 7 shows a cross-sectional view of a ground connector within the rest of a test connector in a second embodiment of the present invention.
Figure 8:
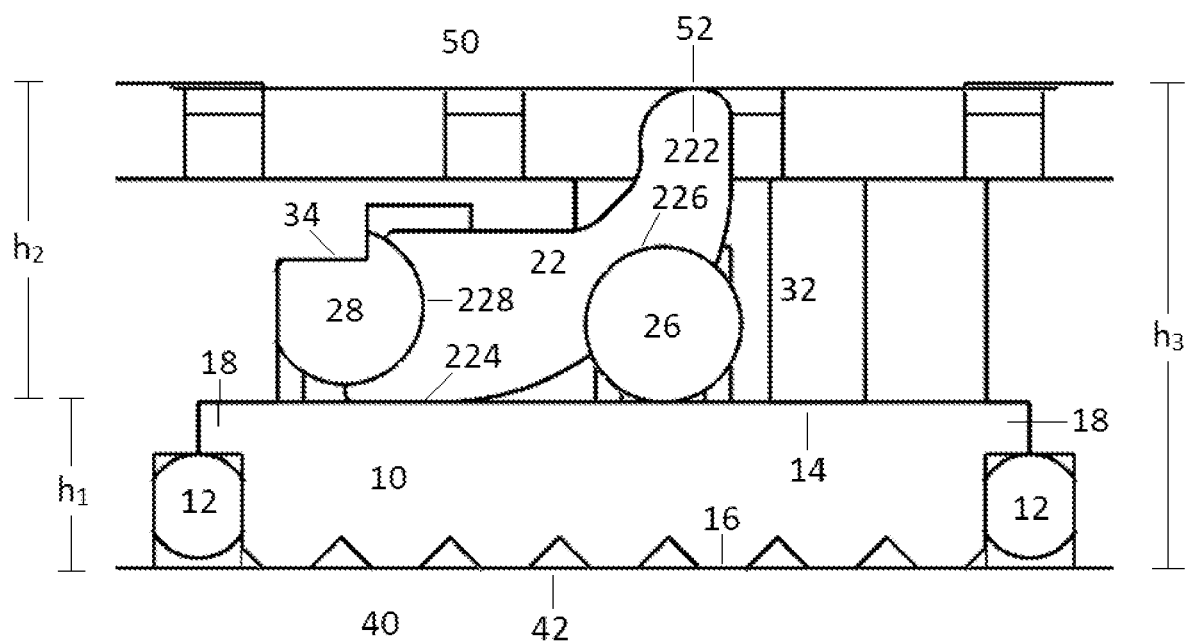
FIG. 8 shows an enlarged cross-sectional view of a ground connector in a second embodiment of the present invention.

FIG. 7 shows a cross-sectional view of an electrical ground connector positioned within the rest of a test connector used to establish electrical connection between a load board (40) of a test apparatus and an integrated circuit (IC) device (50) in a second embodiment of the present invention. To be clear, "test connector" refers to the ground connector of this invention and the other elements that comprise the test connector, including the signal pins located along a perimeter of the test connector. FIG. 8 is an enlarged view of FIG. 7, showing the ground connector of this second embodiment in more detail. Referring to both FIGS. 7 and 8, the structure and function of the ground connector in this second embodiment will now be described.

In this second embodiment, there is provided an electrically conductive rigid ground block (10) having a height $h_1$ and a bottom surface (16) in electrical contact with a contact pad (42) of the load board (40) of the testing apparatus, and a top surface (14). Along two opposing sides and near the top of the ground block (10) are protrusions or hooks (18) running along the length of each opposing side. These hooks (18) extend outwards so that the top surface (14) is slightly larger than the bottom surface (16). The function of these hooks (18) is to hook onto a pair of ground block retentions (12). Once the ground connector is assembled, the retentions (12) secure the ground block (10) to the test connector, and prevents it from dropping when the test connector is lifted off the load board (40). These retentions (12) can be made of an electrical conductor such as beryllium copper. In this second embodiment, the bottom surface (16) is not flat as in the first embodiment above, but spiked or bumped in a repetitive fashion across its surface. In some cases, the load board may have been previously used with other solutions such as resilient connectors that scrap against it, thus leaving dents or scratches on the load board surface. These spikes function to provide better electrical contact with the load board (40) in these cases and other cases where the load board contact pads (42) are rough or uneven.

As with the first embodiment above, in this second embodiment, there is also provided a dual elastomer contact (20) vertically above and in contact with the ground block (10) and having a height $h_2$. This dual elastomer contact (20) comprises three main structural elements: a contact body (22), a first elastomer (26), and a second elastomer (28). The contact body (22) is a single piece and made of an electrically conductive material. The contact body (22) has a contact tip (222) located at a top end of the contact body and in electrical contact with a contact pad (52) of the integrated circuit device (50) during a test, a contact surface (224) located at a bottom end of the contact body and in electrical contact with the top surface (14) of the ground block, a first cavity (226) for receiving the first elastomer (26) and a second cavity (228) for receiving the second elastomer (28). The first elastomer (26) and the second elastomer (28) are made of a non-conductive resilient material, and are generally fashioned into cylinder shaped lengths so that each elastomer can be used as a resilient member for multiple contacts that are arranged in a row. The first elastomer (26) is held securely by the first cavity (226) and the ground block top surface (14). In a variation of this second embodiment, the first elastomer (26) can further be secured by a first housing wall (32). The second elastomer (28) is held securely by the second cavity (228) and a second housing wall (34).

Similar to the first embodiment above, the rigid block (10) in this second embodiment has a height $h_1$ and the dual elastomer contact (20) has a height $h_2$. The total distance or height from the load board (40) to the IC device ground contact pads (52) is $h_3$. As there are many combinations of settings and setups in IC device testing, the height $h_3$ can vary. This invention allows the use of a dual elastomer contact (20) of a given height to be used as a resilient ground connector by simply adjusting the height $h_1$ of the ground block (10) in accordance with the formula $h_1+h_2=h_3$.

Figure 9:
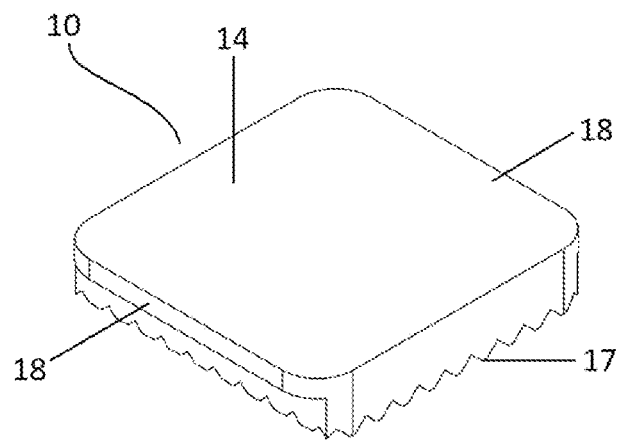
FIG. 9 shows a top perspective view of a rigid block in a second embodiment of the present invention.
Figure 10:
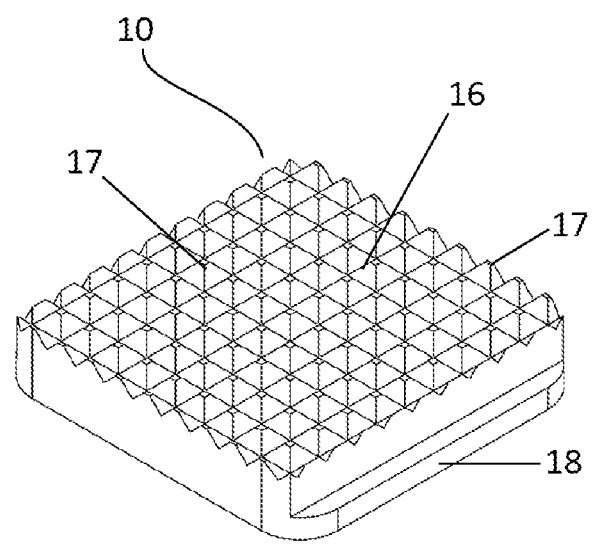
FIG. 10 shows a bottom perspective view of a rigid block in a second embodiment of the present invention.

FIGS. 9 and 10 show, respectively, top and bottom perspective views of the ground block in the second embodiment of this invention. There is shown the ground block (10) which is a single piece of an electrically conductive material such as copper alloys including but not limited to beryllium copper having a top surface (14) and a bottom surface (16). In this second embodiment, the bottom surface (16) is fashioned into protrusions such as spikes or bumps in a repetitive fashion across its surface. The ground block hooks (18) running along the length of each opposing side of the top surface (14) can be clearly seen in these figures.

Figure 11:
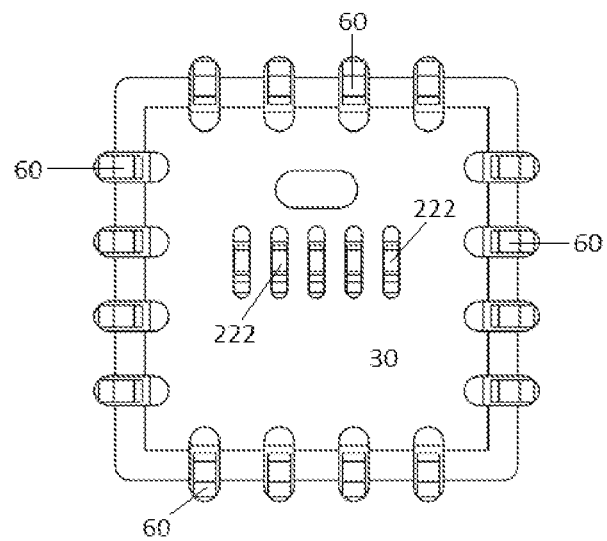
FIG. 11 shows a top view of a ground connector within the rest of a test connector in an embodiment of the present invention.

FIG. 11 shows a top view of a test connector showing the contact tips (222) of the ground connector in both the first and second embodiment of this invention protruding upwards and through slots in the housing (30). The signal pins (60) of the test connector forming a square perimeter around a central area where the ground connecter is placed can also be seen in this figure.

Figure 12:
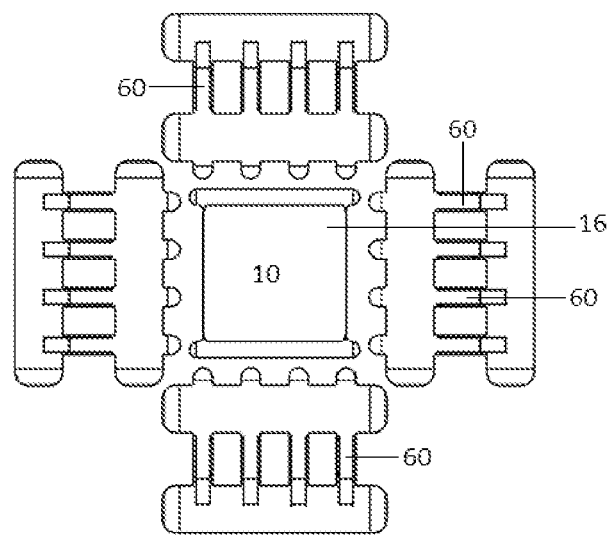
FIG. 12 shows a bottom view of a ground connector within the rest of a test connector in an embodiment of the present invention.

FIG. 12 shows a bottom view of a test connector showing the bottom surface (16) of the ground block (10) in the first embodiment of this invention. The signal pins (60) of the test connector forming a square perimeter around a central area where the ground connecter is placed can also be seen in this figure.

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. A ground connector for use as part of a test connector in an integrated circuit device testing apparatus, comprising:
    an electrically conductive rigid ground block having a height $h_1$ and a bottom surface in electrical contact with a contact pad of a load board of the testing apparatus;
    a dual elastomer contact vertically above and contiguous with the ground block and having a height $h_2$, and comprising: a first elastomer, a second elastomer, a contact body having a contact tip located at a top end of the contact body and in electrical contact with a contact pad of the integrated circuit device during a test, a contact surface located at a bottom end of the contact body and in electrical contact with a top surface of the ground block, a first cavity for receiving the first elastomer and a second cavity for receiving the second elastomer
    wherein $h_1+h_2=h_3$, $h_3$ being the height from the load board contact pad to the integrated circuit device contact pad; and
    a means of securing the ground block to the rest of the ground connector.

2. The ground connector for use as part of the test connector in the integrated circuit device testing apparatus according to claim 1, wherein the said means of securing the ground block is a pair of retentions located underneath a pair of hooks extending from opposing sides of the top surface of the ground block and running along the length of each said opposing side, such that the retentions engage the hooks thus preventing the ground block from dropping away from the test connector.

3. The ground connector for use as part of the test connector in the integrated circuit device testing apparatus according to claim 1, wherein the ground block bottom surface is fashioned into protrusions that cover at least a portion of the bottom surface.

* * * * *